(12) United States Patent
Takemura et al.

(10) Patent No.: US 7,521,801 B2
(45) Date of Patent: Apr. 21, 2009

(54) SEMICONDUCTOR DEVICE

(75) Inventors: Koji Takemura, Osaka (JP); Hiroshige Hirano, Nara (JP); Yutaka Itoh, Kyoto (JP); Koji Koike, Osaka (JP)

(73) Assignee: Panasonic Corporation, Osaka (JP)

(*) Notice: Subject to any disclaimer, the term of this patent is extended or adjusted under 35 U.S.C. 154(b) by 233 days.

(21) Appl. No.: 11/584,561

(22) Filed: Oct. 23, 2006

(65) Prior Publication Data

US 2007/0096320 A1    May 3, 2007

(30) Foreign Application Priority Data

Oct. 28, 2005    (JP) ............................. 2005-313622

(51) Int. Cl.
*H01L 21/00* (2006.01)
(52) U.S. Cl. .................. 257/751; 257/748; 257/762; 257/763; 257/764; 257/781; 257/E23.02; 257/E23.016

(58) Field of Classification Search ................. 257/748, 257/751, 757, 764, 781, E23.02, E23.16
See application file for complete search history.

(56) References Cited

U.S. PATENT DOCUMENTS 6,218,732 B1 *  4/2001  Russell et al. ............... 257/748
6,960,831 B2 * 11/2005  Burrell et al. ............... 257/751

FOREIGN PATENT DOCUMENTS

| JP | 2001-15516  A | 1/2001 |
| JP | 2002-353221 A | 12/2002 |
| JP | 2003-31575  A | 1/2003 |
| JP | 2005-19493  A | 1/2005 |

* cited by examiner

*Primary Examiner*—Michael S Lebentritt
(74) *Attorney, Agent, or Firm*—McDermott Will & Emery LLP

(57) ABSTRACT

A Ti barrier film and a TiN barrier film are formed between a top-level pad made of copper or an alloy film mainly composed of copper and an Al pad. The Ti barrier film is formed to have a greater thickness than the TiN barrier film.

19 Claims, 7 Drawing Sheets

SEMICONDUCTOR DEVICE

BACKGROUND OF THE INVENTION (a) Fields of the Invention

The present invention relates to semiconductor devices including pads for bonding which are electrically continuous with Cu interconnects.

(b) Description of Related Art

In recent years, Cu wiring processes have been positively introduced for the purpose of attaining speed enhancement and miniaturization of semiconductor devices. In the case where a Cu pad for bonding is composed of part of Cu wiring, the top of the Cu pad is formed with an aluminum interconnect (Al pad). In this case, if copper contained in the Cu pad exudes into the Al pad, some troubles occur in which the Al pad corrodes or Al hardens due to impurity mixing (hardening caused by impurities). The Cu exudation will possibly have an adverse effect on the Al pad in process steps conducted on the Al pad, such as wafer test probing and wafer dicing after completion of a wafer process, and a wire bonding step and a package sealing step during package assembly.

Hereinafter, a conventional semiconductor device including a Cu pad and an Al pad (see, for example, Japanese Unexamined Patent Publication No. 2002-353221) will be described with reference to the accompanying drawings.

FIGS. 8A and 8B are sectional views showing main parts of the conventional semiconductor device. Referring to FIGS. 8A and 8B, the conventional semiconductor device includes: a copper connection via 111 embedded in an intermediate insulating film 108 on a silicon substrate 101; an Al pad 113 formed above the copper connection via 111 and embedded in a protective insulating film 115; and a barrier metal 112 of TaN formed between the Al pad 113 and the copper connection via 111. With such a structure, the barrier metal 112 blocks copper diffusion from the copper connection via 111 to prevent copper mixing into the Al pad and improve the bonding capability of the pad.

Another conventional semiconductor device includes a device in which a barrier metal serving as an adhesion layer or a diffusion inhibiting layer is provided between a Cu pad and an Al pad to prevent the reaction between copper and aluminum and oxidation of the Cu pad (see, for example, Japanese Unexamined Patent Publications Nos. 2001-15516, 2005-19493, and 2003-31575).

SUMMARY OF THE INVENTION

However, even after formation of the Al pad, a processing at high temperatures more than 300° C. may be performed on the device. Because of this high-temperature processing, even the conventional semiconductor device mentioned above cannot fully eliminate Cu exudation to the Al pad. As a result, the Cu exudation to the Al pad causes corrosion of the Al pad, which disadvantageously leads to attachment failure of wire bonding or degradation in the pad reliability after package sealing. Moreover, hardening caused by impurities occurs in the Al pad, which disadvantageously results in yield reduction due to abnormal contact resistance in probing, or results in poor wire bonding.

Note that there has conventionally been no disclosure about detailed information on, for example, which material as a barrier metal provided between the Al pad and the Cu interconnect is effective at preventing copper exudation.

In view of the above problems, an object of the present invention is to provide a highly-reliable semiconductor device which prevents copper exudation from a Cu interconnect into a metal pad of aluminum or the like to improve the stabilities of process steps conducted on the metal pad.

To attain the above object, the inventors made various studies of barrier metals for preventing copper exudation, and finally found out the fact that a barrier film made of Ti can prevent copper exudation most effectively.

Based on the finding described above, a semiconductor device according to a first aspect of the present invention comprises: a first wiring containing copper and formed above a semiconductor substrate; a first barrier film made of Ti formed on the first wiring and having a thickness of 100 nm or more; and a second wiring formed on the first barrier film.

With the semiconductor device according to the first aspect of the present invention, the first barrier film of Ti is formed to have a thickness of 100 nm or more. Thus, even in the case where a high-temperature thermal processing is performed after formation of the second wiring, copper exudation can be prevented. This suppresses hardening of the second wiring caused by impurities to suppress yield reduction due to abnormal contact resistance in probing. Moreover, in the case of conducting wire bonding on the top of the second wiring, poor wire bonding resulting from copper exudation can be prevented. Furthermore, corrosion of the material for the second wiring can be suppressed to prevent attachment failure of the wire bonding or degradation in the pad reliability after package sealing.

A semiconductor device of a second aspect of the present invention comprises: a first wiring containing copper and formed above a semiconductor substrate; a first barrier film made of Ti formed on the first wiring; a second barrier film made of TiN formed on the first barrier film and having a smaller thickness than the first barrier film; and a second wiring formed on the second barrier film.

With the semiconductor device according to the second aspect of the present invention, the first and second barrier films are formed. Thus, even in the case where a high-temperature thermal processing is performed after formation of the second wiring, the underlying first barrier film of Ti having a greater thickness can prevent copper exudation more effectively. This suppresses hardening of the second wiring caused by impurities to suppress yield reduction due to abnormal contact resistance in probing. Moreover, in the case of conducting wire bonding on the top of the second wiring, poor wire bonding can be prevented. Furthermore, corrosion of the material for the second wiring can be suppressed to prevent attachment failure of the wire bonding or degradation in the pad reliability after package sealing.

In addition, with the semiconductor device according to the second aspect of the present invention, the second barrier film of TiN is formed between the first barrier film of Ti and the second wiring. Thus, an interdiffusion reaction between the materials for the first and second wirings can also be prevented. Therefore, the adhesion between the barrier films and the second wiring can be further enhanced to prevent exfoliation of the second wiring. This in tern prevents poor wire bonding or poor reliability occurring by stress generated by pressing a gold ball in wire bonding onto the second wiring or tensile stress generated during wire looping control.

In the semiconductor device according to the second aspect of the present invention, the first barrier film may have a thickness of 100 nm or more, and the second barrier film may have a thickness of 10 nm or more. In this case, copper exudation can be prevented more certainly.

In the semiconductor device according to the first and second aspects of the present invention, the second wiring may be made of Al. In this case, the adhesion to the first barrier film of Ti is enhanced.

In the semiconductor device according to the first and second aspects of the present invention, the second wiring may be a pad for bonding.

DETAILED DESCRIPTION OF THE PREFERRED EMBODIMENTS

First Embodiment

Figure 1:
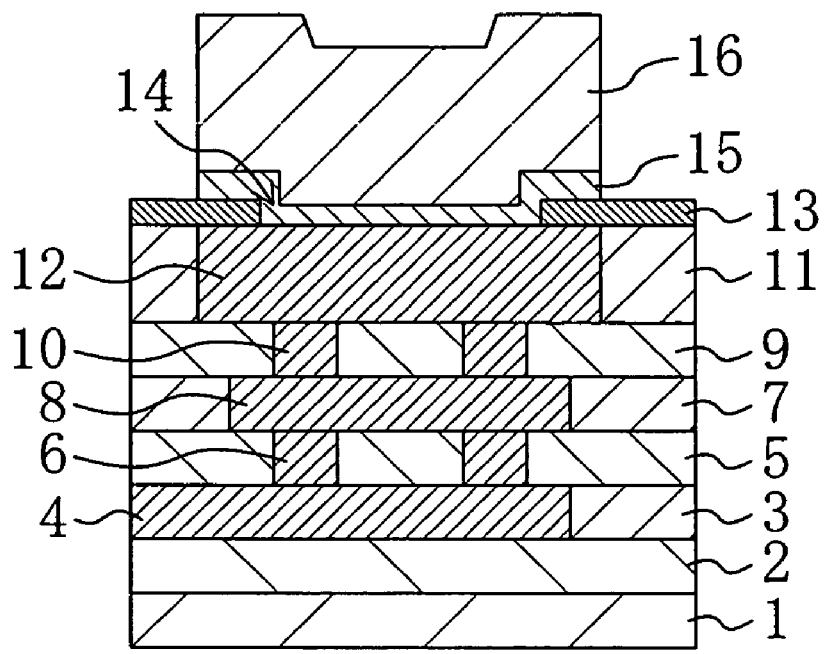
FIG. 1 is a sectional view showing the structure of a semiconductor device according to a first embodiment of the present invention.

A first embodiment of the present invention will be described below with reference to the accompanying drawings. FIG. 1 is a sectional view showing the structure of a semiconductor device according to the first embodiment of the present invention. Note that FIG. 1 shows an exemplary structure in which three levels of wiring are constructed and illustration of a diffusion layer and a transistor structure is omitted.

Referring to FIG. 1, in the semiconductor device of the first embodiment, the top of a semiconductor substrate 1 of silicon with semiconductor elements (not shown) provided thereon is formed with a first insulating film 2 made of a silicon oxide film, a silicon nitride film, or the like. A second insulating film 3 of a silicon oxide film, a silicon nitride film, or the like and a first layer wiring 4 of Cu or a Cu alloy are formed on the first insulating film 2. A third insulating film 5 of a silicon oxide film, a silicon nitride film, or the like and a via plug 6 of Cu or the like in contact with the first layer wiring 4 are formed on the second insulating film 3 and the first layer wiring 4. A fourth insulating film 7 of a silicon oxide film, a silicon nitride film, or the like and a second layer wiring 8 in contact with the via plug 6 are formed on the third insulating film 5 and the via plug 6. A fifth insulating film 9 of a silicon oxide film, a silicon nitride film, or the like and a via plug 10 of Cu or the like in contact with the second layer wiring 8 are formed on the fourth insulating film 7 and the second layer wiring 8. A sixth insulating film 11 and a pad 12 of Cu or a Cu alloy in contact with the via plug 10 are formed on the fifth insulating film 9 and the via plug 10. A passivation film 13 located in top level is formed on the sixth insulating film 11 and the pad 12. In the passivation film 13, an opening 14 is formed which exposes the top surface of the center portion of the pad 12. A Ti barrier film 15 covers a region lying from the top portion of the pad 12 exposed in the opening 14 to a portion of the top surface of the passivation film 13 located around the pad. An Al pad 16 is formed on the Ti barrier film 15. Although not shown, the Al pad 16 is connected to an end of a bonding wire made of a thin wire of Au, Al, or the like. The bonding wire is connected to an external circuit such as an electrode terminal of a package. In the first embodiment, description is made of the case where the three layer wirings composed of the first layer wiring 4, the second layer wiring 8, and the pad 12 are formed as interconnection layers. However, it is needless to say that the present invention can also be applied to a multilevel interconnects other than the three wiring layers.

Figure 2A:
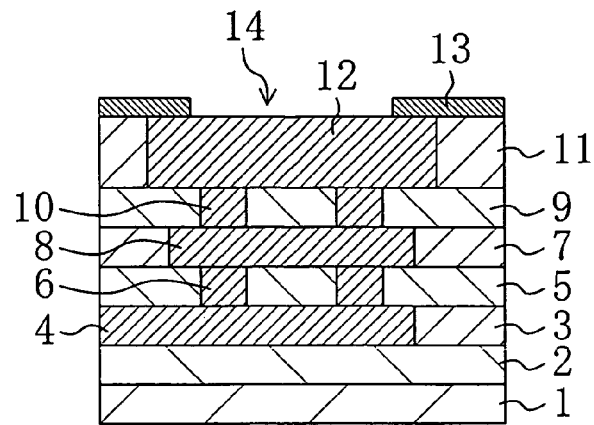
FIGS. 2A to 2C are sectional views showing process steps of a method for fabricating a semiconductor device according to the first embodiment.
Figure 2B:
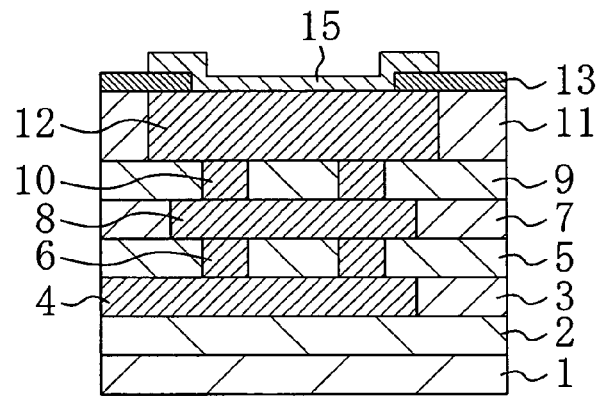
Figure 2C:
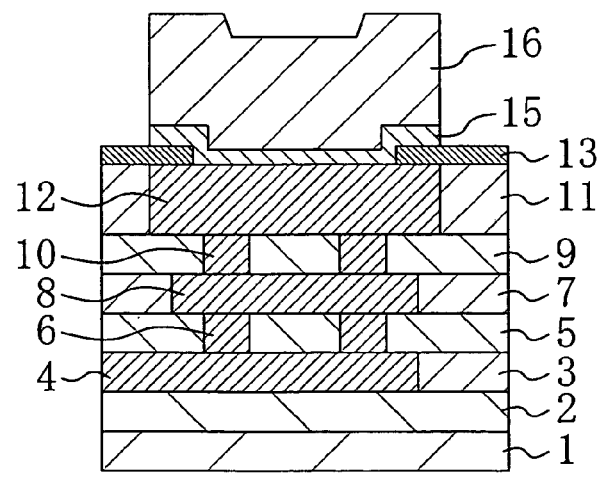

Next, a method for fabricating a semiconductor device according to the first embodiment will be described with reference to FIGS. 2A to 2C. FIGS. 2A to 2C are sectional views showing process steps of the method for fabricating a semiconductor device according to the first embodiment. In the method for fabricating a semiconductor device according to the first embodiment, first, the first insulating film 2, the second insulating film 3 and the first layer wiring 4, the third insulting film 5 and the via plug 6 of Cu or the like, the fourth insulating film 7 and the second layer wiring 8, the fifth insulating film 9 and the via plug 10 of Cu or the like, and the sixth insulating film 11 and the pad 12 of Cu are formed in this order on the semiconductor substrate 1, wherein the second insulating film 3 and the first layer wiring 4 are formed on the first insulating film 2, the third insulating film 5 and the via plug 6 are formed thereon, the fourth insulating film 7 and the second layer wiring 8 are formed thereon, the fifth insulating film 9 and the via plug 10 are formed thereon, and the sixth insulating film 11 and the pad 12 are formed thereon. The wirings 4 and 8 and the via plugs 6 and 10 are formed using methods such as a damascene method, respectively.

Next, on the sixth insulating film 11 and the pad 12, the passivation film 13 of, for example, SiN is formed which has a thickness of about 150 to 300 nm. A photoresist is formed on the passivation film 13 and etching is performed to remove a portion of the passivation film 13 located on the pad 12, thereby forming the opening 14. Thereafter, the photoresist is removed (FIG. 2A).

Then, a sputtering method is conducted to form the Ti barrier film 15 on the passivation film 13 and the portion of the pad 12 exposed in the opening 14. The Ti barrier film 15 is made of Ti and has a thickness of 100 nm or more. Thereafter, a photoresist (not shown) is formed on the Ti barrier film 15, and a portion of the Ti barrier film 15 lying in contact with the pad 12 and its vicinity are retained by removing an unwanted portion of the Ti barrier film 15. The photoresist is then removed (FIG. 2B). The Ti barrier film 15 has a very good adhesion to the passivation film 13, and can prevent copper exudation to the Al pad.

Next, a sputtering method is conducted to form an aluminum alloy film having a thickness of about 1000 nm on the Ti barrier film 15 and a portion of the passivation film 13 located around the Ti barrier film 15. A photoresist is formed on the formed aluminum alloy and a RIE (reactive ion etching) method is conducted to pattern the aluminum alloy film. Thereby, the Al pad 16 is formed on the Ti barrier film 15. The photoresist is then removed (FIG. 2C). With the process steps shown above, the semiconductor device of the first embodiment is fabricated.

In the above description, explanation has been made of the case where patterning on the Ti barrier film 15 is conducted in the step shown in FIG. 2B and then patterning on the Al pad 16 is conducted in the step shown in FIG. 2C. Alternatively, the Ti barrier film 15 and the aluminum alloy film may be patterned at a time after formation of these films.

Figure 3:
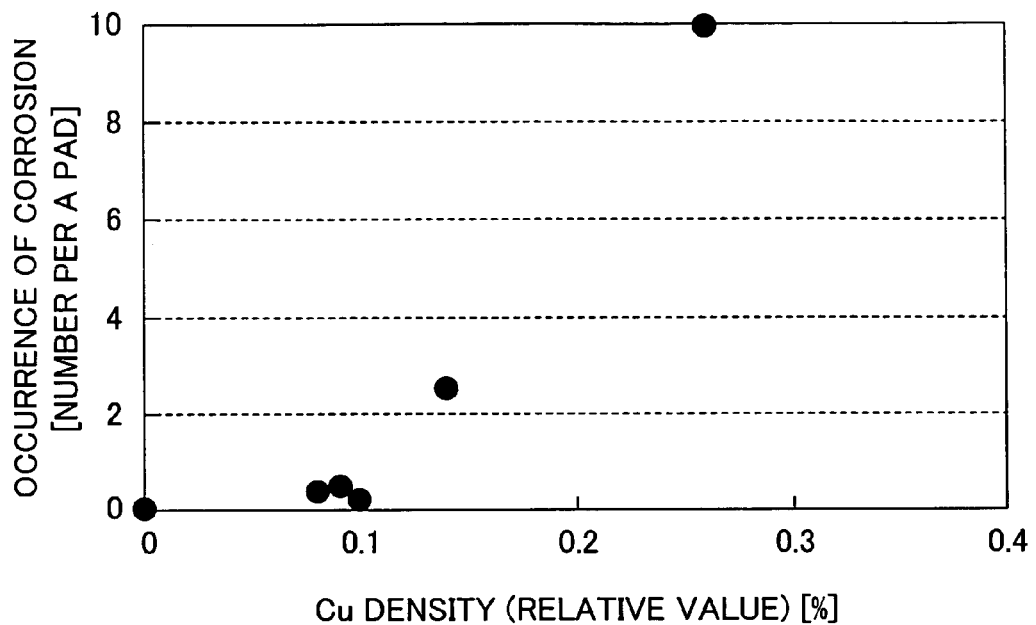
FIG. 3 is a graph showing experimental results about the relation between the copper density in an Al pad and the frequency of occurrence of Al pad corrosion.

FIG. 3 is a graph showing experimental results about the relation between the copper density in the Al pad and the frequency of occurrence of Al pad corrosion. As shown in FIG. 3, it is confirmed that if the relative value of the copper density in the Al pad is about 0.1% or lower, pad corrosion hardly occurs. Based on this fact, various structures of the device capable of having a copper density in the pad of 0.1% or lower were studied. In order to have a copper density in the pad of 0.1% or lower, it is necessary to prevent copper diffusion from the pad 12.

From various experiments, it is found that the thickness of the barrier film by which the copper density in the pad can be controlled to 0.1% or lower is 100 nm or more. The measurement was carried out under a temperature condition of 400° C.

Figure 4:
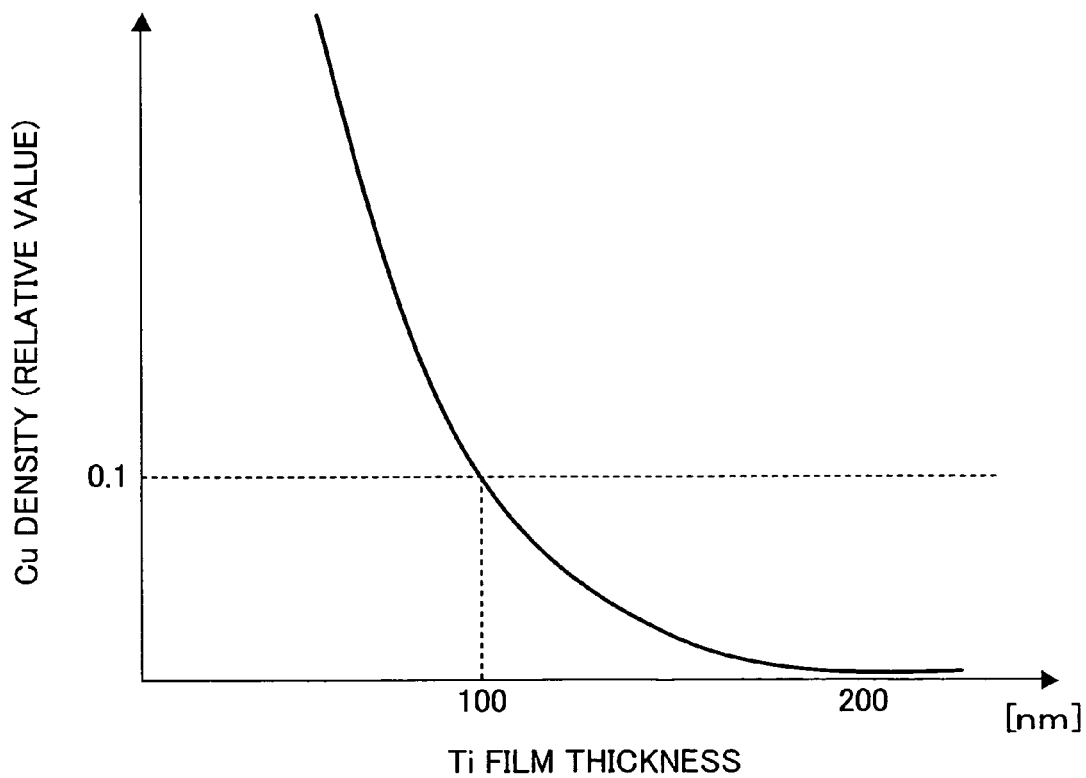
FIG. 4 is a graph showing the thickness of a barrier film by which the copper density in the pad can be controlled to 0.1% or lower.

FIG. 4 is a graph showing the thickness of the barrier film by which the copper density in the pad can be controlled to 0.1% or lower. FIG. 4 shows the results obtained by measuring the copper density in the Al pad when the thickness of the barrier film formed between the Cu interconnect and the Al pad is changed.

As is apparent from this figure, the Ti film having a thickness of 100 nm or more can control the copper density in the pad to 0.1% or lower.

In addition, it is assumed that a thermal processing after formation of the Al pad is performed on the condition that: hydrogen sintering for improving the transistor characteristics is performed at about 400° C.; the temperature for deposition of the passivation film lying on the topmost layer of the chip is 390° C.; and the temperature for curing of a protective resin film (polybenzoxazole (PBO) film) lying on the topmost layer of the chip is 330° C. In this case, from the experiments, the structure of this embodiment having a copper density in the pad of 0.1% or lower was confirmed to exert a sufficient effect of preventing copper exudation. Note that even though a thermal processing other than this case is performed after the pad formation, copper exudation can be prevented. Specifically, to say nothing of a thermal processing at 400° C. or higher, even though a thermal processing at 400° C. or lower is performed thereafter, copper exudation into the pad can be effectively prevented. A general high-temperature processing is listed as follows: hydrogen sintering for improving the transistor characteristics, performed at 400 to 450° C.; deposition of the passivation film lying on the topmost layer of the chip, performed at 350 to 350° C.; and curing of the protective resin film lying on the topmost layer of the chip, performed at 300 to 340° C. for the PBO film and at 350 to 400° C. for a polyimide film. Even though such a thermal processing is performed within these temperature ranges, copper exudation into the pad can be prevented effectively.

In the first embodiment, the Ti barrier film 15 is formed to have a thickness of 100 nm or more. Therefore, even in the case where a high-temperature thermal processing is performed after formation of the Al pad 16, copper exudation from the pad 12 can be prevented. This suppresses hardening of the Al pad 16 caused by impurities to suppress yield reduction due to abnormal contact resistance in probing. Moreover, in the case of conducting wire bonding on the top of the Al pad 16, poor wire bonding can be prevented. Furthermore, corrosion of the Al pad 16 can be suppressed to prevent attachment failure of the wire bonding or degradation in the pad reliability after package sealing.

In the first embodiment, the Al pad 16 is employed as a pad formed on the Ti barrier film 15. However, even if a pad made of Ni or Au other than Al is formed, the effects of the first embodiment can be exerted.

Second Embodiment

Figure 5:
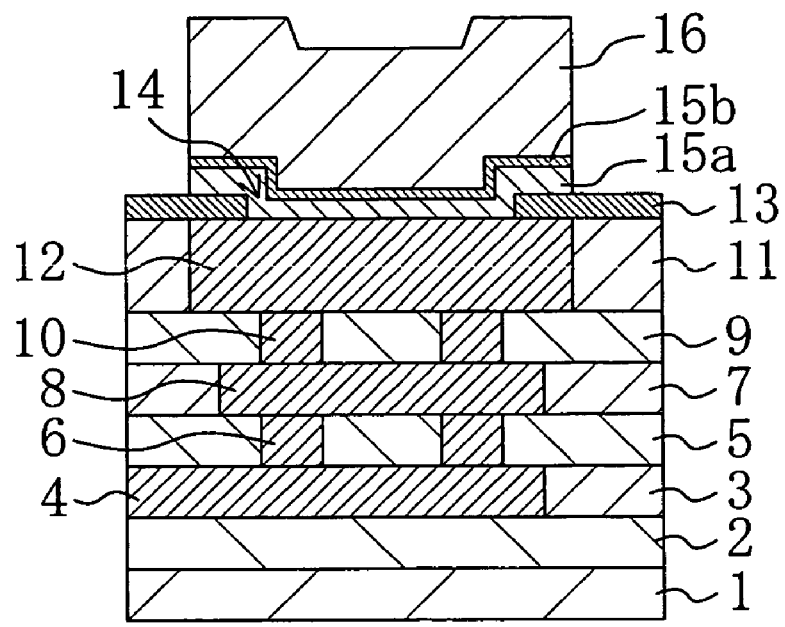
FIG. 5 is a sectional view showing the structure of a semiconductor device according to a second embodiment of the present invention.

A second embodiment of the present invention will be described below with reference to the accompanying drawings. FIG. 5 is a sectional view showing the structure of a semiconductor device according to the second embodiment of the present invention. Referring to FIG. 5, the semiconductor device of the second embodiment has a TiN barrier film 15b formed on a Ti barrier film 15a. The other construction thereof is identical to that of the first embodiment, so that its description will be omitted by retaining the same reference numerals as those of the first embodiment.

Next, a method for fabricating a semiconductor device according to the second embodiment will be described with reference to FIGS. 6A to 6D. FIGS. 6A to 6D are sectional views showing process steps of the method for fabricating a semiconductor device according to the second embodiment. In the method for fabricating a semiconductor device according to the second embodiment, first, the same steps as those described in the first embodiment are carried out to form the structure shown in FIG. 6A.

Figure 6A:
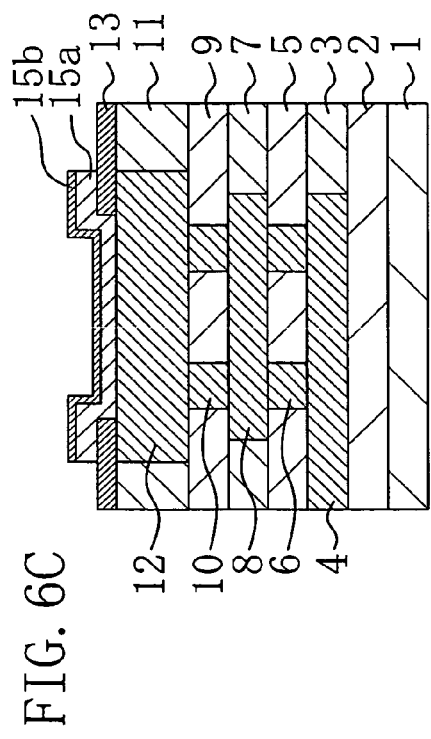
FIGS. 6A to 6D are sectional views showing process steps of a method for fabricating a semiconductor device according to the second embodiment.
Figure 6C:
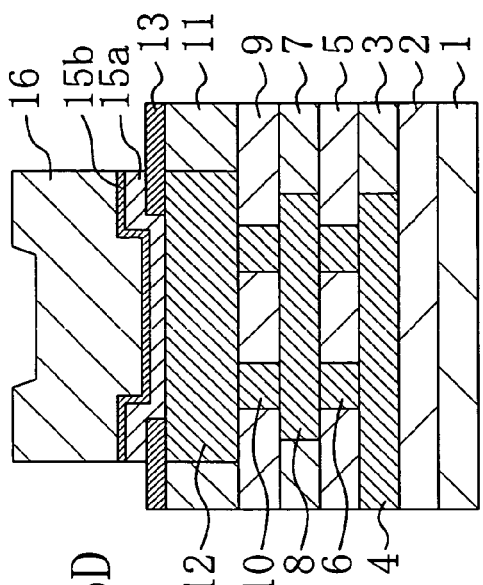
Figure 6B:
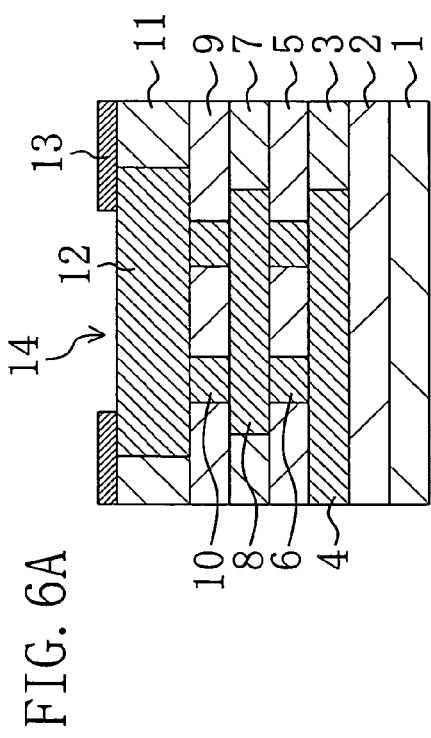

Subsequently, a sputtering method is conducted to form the Ti barrier film 15a having a thickness of about 100 nm on the passivation film 13 and a portion of the pad 12 exposed in the opening 14. Thereafter, a photoresist is formed on the Ti barrier film 15a, and a portion of the Ti barrier film 15a lying in contact with the pad 12 and its vicinity are retained by removing an unwanted portion of the Ti barrier film 15a. The photoresist is then removed (FIG. 6B). The Ti barrier film 15a has a very good adhesion to the passivation film 13, and can prevent copper exudation.

Next, a sputtering method is conducted to form the TiN barrier film 15b having a thickness of about 30 nm on the Ti barrier film 15a and a portion of the passivation film 13 located around the film 15a. The thicknesses of the Ti barrier film 15a and the TiN barrier film 15b are not limited to the values mentioned above, but these films are formed so that the Ti barrier film 15a has a greater thickness than the TiN barrier film 15b. Thereafter, a photoresist is formed on the TiN barrier film 15b and RIE is performed to remove a portion of the TiN barrier film 15b located on the passivation film 13 and retain a portion thereof located on the Ti barrier film 15a. The photoresist is then removed (FIG. 6C).

Figure 6D:
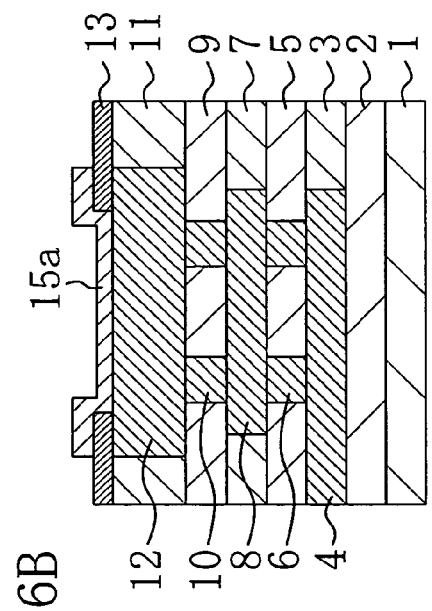

Next, an aluminum alloy film having a thickness of about 1000 nm is formed on the TiN barrier film 15b and a portion of the passivation film 13 located around the film 15b. A photoresist is then formed on the aluminum alloy and a RIE method is conducted to pattern the aluminum alloy film. Thereby, the Al pad 16 is formed on the TiN barrier film 15b. The photoresist is then removed (FIG. 6D). With the process steps shown above, the semiconductor device of the second embodiment is fabricated.

Herein, the barrier performances of the Ti barrier film and the TiN barrier film will be described. Samples with TiN/Ti thicknesses of 30/100 nm and 100/30 nm were prepared and analyzed for the state of copper exudation into the Al pad. As a result of this analysis, the amount of copper exudation through the former sample was less than that through the latter sample. Likewise, comparison was made between samples with TiN/Ti thicknesses of 40/90 nm and 90/40 nm. As a result of this, the amount of copper exudation through the former sample was less than that through the latter sample.

From these results, it is found that the thickness of the Ti barrier film is preferably equal to or greater than the thickness of the TiN barrier film.

In the second embodiment, the Ti barrier film 15a and the TiN barrier film 15b are formed. Therefore, even in the case where a high-temperature thermal processing is performed after formation of the Al pad 16, copper exudation can be prevented. This suppresses hardening of the Al pad 16 caused by impurities to suppress yield reduction due to abnormal contact resistance in probing. Moreover, in the case of conducting wire bonding on the top of the Al pad 16, poor wire bonding can be prevented. Furthermore, corrosion of the material for the Al pad 16 can be suppressed to prevent attachment failure of the wire bonding or degradation in the pad reliability after package sealing.

In the second embodiment, since the TiN barrier film 15b is formed between the Ti barrier film 15a and the Al pad 16, an interdiffusion reaction between Ti and Al can also be prevented. Thus, the adhesion between the barrier films 15a and 15b and the Al pad 16 can be further enhanced, so that exfoliation of the Al pad 16 can be prevented. This in tern prevents poor wire bonding or poor reliability occurring by stress generated by pressing a gold ball in wire bonding onto the Al pad 16 or tensile stress generated during wire looping control.

Modification of Second Embodiment

A modification of the second embodiment will be described below with reference to the accompanying drawings. The description of this modification will be made with reference to FIGS. 5 and 6 again that have been used for the explanation of the second embodiment. In this modification, the Ti barrier film 15a shown in FIG. 5 is set to have a thickness of 100 nm or more, and the TiN barrier film 15b is set to have a thickness of 10 nm or more. The other construction thereof is identical to that of the second embodiment, so that detailed description thereof will be omitted.

Next, a method for fabricating a semiconductor device according to this modification will be described. In this modification, a sputtering method is conducted in the step shown in FIG. 6B to form the Ti barrier film 15a on the passivation film 13 and a portion of the pad 12 exposed in the opening 14. The Ti barrier film 15a is made of Ti and has a thickness of 100 nm or more. Thereafter, a photoresist is formed on the Ti barrier film 15a, and a portion of the Ti barrier film 15a lying in contact with the pad 12 and its vicinity are retained by removing an unwanted portion of the Ti barrier film 15a. The photoresist is then removed.

Subsequently, in the step shown in FIG. 6C, a sputtering method is conducted to form the TiN barrier film 15b having a thickness of 10 nm or more on the Ti barrier film 15a and a portion of the passivation film 13 located around the film 15a. Thereafter, a photoresist is formed on the TiN barrier film 15b and RIE is performed to remove a portion of the TiN barrier film 15b located on the passivation film 13 and retain a portion thereof located on the Ti barrier film 15a. The photoresist is then removed. The other process steps of the fabrication method are identical to those of the second embodiment, so that their description is omitted.

Figure 7:
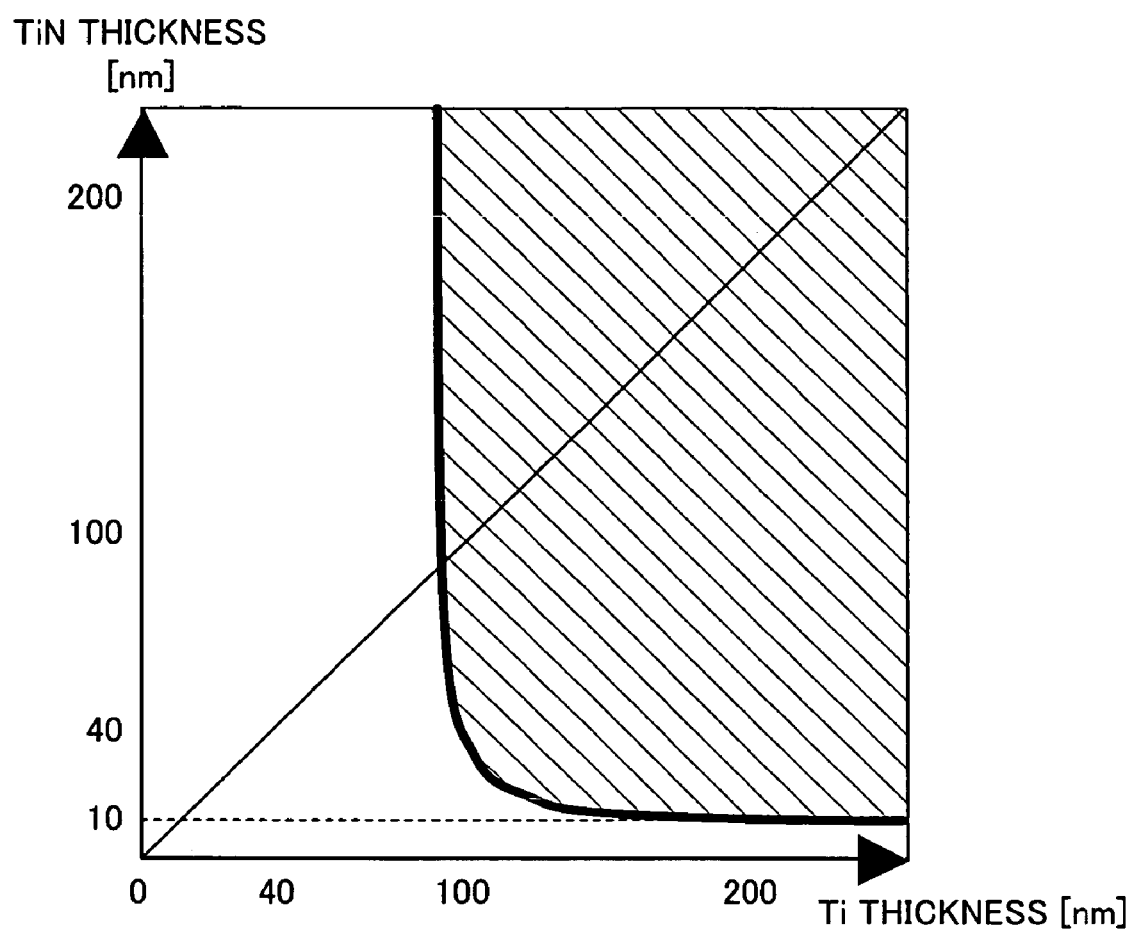
FIG. 7 is a graph showing the thickness of a barrier film by which the copper density in a pad can be controlled to 0.1% or lower.
Figure 8A:
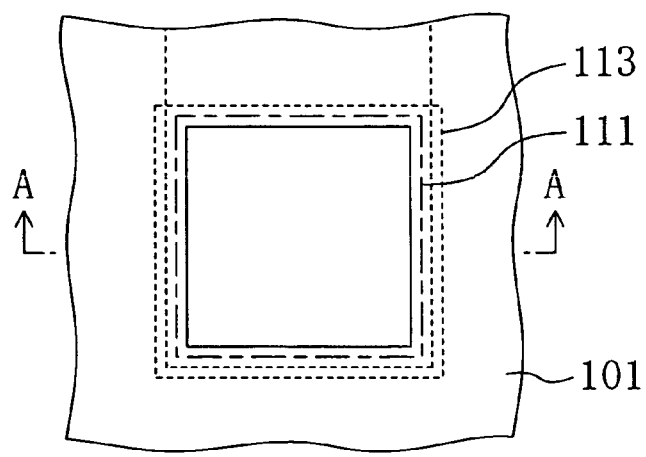
FIGS. 8A and 8B are sectional views showing main parts of a conventional semiconductor device.
Figure 8B:
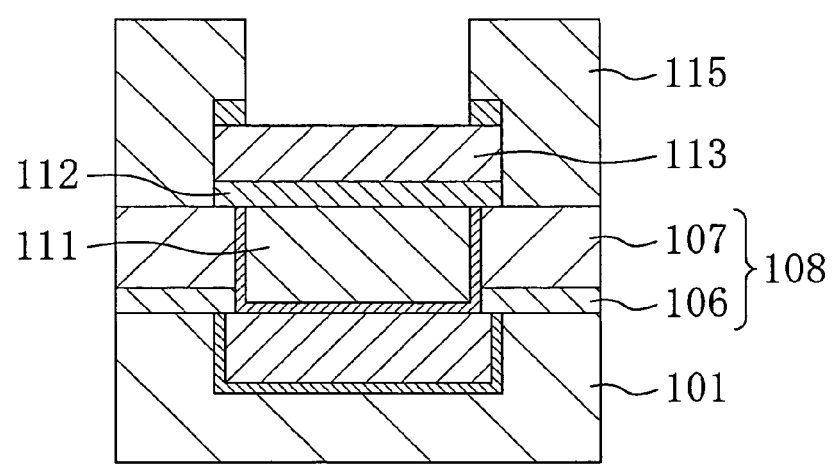

FIG. 7 is a graph showing the thickness of the barrier film by which the copper density in the pad can be controlled to 0.1% or lower. FIG. 7 shows the results obtained by measuring the copper density in the Al pad when the thickness of the barrier film formed between the Cu interconnect and the Al pad is changed. As the barrier film, a film made of Ti and a film made of TiN were used. The measurement was carried out under a temperature condition of 450° C. The hatched area of this graph indicates an area within which the copper density in the pad can be controlled to 0.1% or lower. From the result shown in FIG. 7, it is found that preferably, the Ti barrier film is set to have a thickness of 100 nm or more and the TiN barrier film is set to have a thickness of 10 nm or more.

If a thermal processing at a high temperature above 450° C. is performed after formation of the barrier film, the possibility will increase that Ti in the Ti barrier film reacts with the aluminum pad. To avoid this reaction, the TiN film can be provided between the Ti barrier film and the aluminum pad to prevent an interdiffusion reaction between Ti and Al. Specifically, in this case, the TiN barrier film can function not only as a barrier film for inhibiting copper exudation but also as an adhesion layer. Since the interdiffusion reaction between Ti and Al can also occur during a thermal processing at below 450° C., the TiN barrier film can function as an adhesion layer also when a thermal processing is performed at 450° C. or lower. Thus, the reliability of the semiconductor device can be further improved.

This modification can offer the same effects as the second embodiment. In particular, even when a thermal processing is performed at 450° C. or higher, copper exudation can be prevented effectively.

What is claimed is:

1. A semiconductor device comprising:
   a first wiring containing copper and formed above a semiconductor substrate;
   a first barrier film made of Ti formed on and in contact with the first wiring, and having a thickness of 100 nm or more; and
   a second wiring formed on the first barrier film,
   wherein the first wiring is a buried wiring buried in an insulating film.

2. The device of claim 1,
   wherein the second wiring is made of Al or Al alloy.

3. The device of claim 1,
   wherein the second wiring is a pad for bonding.

4. A semiconductor device comprising:
   a first wiring containing copper and formed above a semiconductor substrate;
   a first barrier film made of Ti formed on and in contact with the first wiring;
   a second barrier film made of TiN formed on the first barrier film and having a smaller thickness than the first barrier film; and
   a second wiring formed on the second barrier film,
   wherein the first wiring is a buried wiring buried in an insulating film.

5. The device of claim 4,
   wherein the first barrier film has a thickness of 100 nm or more, and the second barrier film has a thickness of 10 nm or more.

6. The device of claim 4,
   wherein the second wiring is made of Al or Al alloy.

7. The device of claim 4,
   wherein the second wiring is a pad for bonding.

8. The device of claim 1 further comprising a passivation film formed on the first wiring,
   wherein the first barrier film includes a first portion being in contact with the first wiring and located in an opening formed in the passivation film, and a second portion being in contact with the passivation film and located around the first portion.

9. The device of claim 8, wherein the passivation film is made of SiN.

10. The device of claim 8, wherein the passivation film has a thickness of 150 nm through 300 nm.

11. The device of claim 8, wherein
the first wiring is made of Cu or Cu alloy, and
the second wiring is made of Al or Al alloy.

12. The device of claim 1, wherein
the second wiring is an Al pad, and
a copper density in the Al pad is 0.1% or lower.

13. The device of claim 1, wherein to the bottom of the first wiring, a connection via is connected.

14. The device of claim 4 further comprising a passivation film formed on the first wiring,
   wherein the first barrier film includes a first portion being in contact with the first wiring and located in an opening formed in the passivation film, and a second portion being in contact with the passivation film and located around the first portion.

15. The device of claim 14, wherein the passivation film is made of SiN.

16. The device of claim 14, wherein the passivation film has a thickness of 150 nm through 300 nm.

17. The device of claim 14, wherein
the first wiring is made of Cu or Cu alloy, and
the second wiring is made of Al or Al alloy.

18. The device of claim 4, wherein
the second wiring is an Al pad, and
a copper density in the Al pad is 0.1% or lower.

19. The device of claim 4, wherein to the bottom of the first wiring, a connection via is connected.

* * * * *